US011615960B2

(12) United States Patent
Lishan et al.

(10) Patent No.: US 11,615,960 B2
(45) Date of Patent: Mar. 28, 2023

(54) METHOD FOR REMOVING RE-SPUTTERED MATERIAL FROM PATTERNED SIDEWALLS

(71) Applicant: Cornell University, Ithaca, NY (US)

(72) Inventors: David G. Lishan, Clearwater, FL (US); Kyle Dorsey, Ithaca, NY (US); Vincent J. Genova, Ithaca, NY (US)

(73) Assignee: Cornell University, Ithaca, NY (US)

( * ) Notice: Subject to any disclaimer, the term of this patent is extended or adjusted under 35 U.S.C. 154(b) by 92 days.

(21) Appl. No.: 17/110,194

(22) Filed: Dec. 2, 2020

(65) Prior Publication Data

US 2021/0193466 A1 Jun. 24, 2021

Related U.S. Application Data

(60) Provisional application No. 62/949,653, filed on Dec. 18, 2019.

(51) Int. Cl.
| | | |
|---|---|---|
| *H01L 21/00* | (2006.01) | |
| *H01L 21/263* | (2006.01) | |
| *C23C 14/35* | (2006.01) | |
| *H01L 21/02* | (2006.01) | |
| *H01L 21/3213* | (2006.01) | |

(52) U.S. Cl.
CPC .......... *H01L 21/2633* (2013.01); *C23C 14/35* (2013.01); *H01L 21/02266* (2013.01); *H01L 21/32131* (2013.01); *H01L 21/32139* (2013.01)

(58) Field of Classification Search
CPC ............. H01L 21/2633; H01L 21/0272; H01L 21/0331; H01L 21/0337
See application file for complete search history.

(56) References Cited

U.S. PATENT DOCUMENTS

| | | | | |
|---|---|---|---|---|
| 5,192,706 | A * | 3/1993 | Rodder | ............... H01L 21/3081 257/E21.232 |
| 6,117,279 | A * | 9/2000 | Smolanoff | ........ H01J 37/32477 204/192.12 |
| 2004/0087153 | A1 * | 5/2004 | Du | ..................... H01L 21/32139 257/E21.252 |
| 2004/0102041 | A1 * | 5/2004 | Okudaira | ............ H01L 21/0332 438/689 |

(Continued)

FOREIGN PATENT DOCUMENTS

| | | | | |
|---|---|---|---|---|
| KR | 20090083776 | * | 8/2009 | ........... H01L 21/336 |
| RU | 2428766 | C1 * | 9/2011 | ............... B82B 3/00 |

*Primary Examiner* — Reema Patel
(74) *Attorney, Agent, or Firm* — Harvey S. Kauget; Burr & Forman LLP

(57) ABSTRACT

The present invention provides a method for removing re-sputtered material on a substrate. A process chamber having a plasma source and a substrate support is provided along with the substrate having an upper surface and a lower surface. A masking material having a patterned sidewall is patterned onto the upper surface of the substrate along with a sacrificial layer between the upper surface of the substrate and the masking material. The lower surface of the substrate is placed onto the substrate support. A plasma is generated using the plasma source. The substrate is processed on the substrate support using the generated plasma. The sacrificial layer is removed after the processing of the substrate.

12 Claims, 9 Drawing Sheets

(56) References Cited

U.S. PATENT DOCUMENTS

2004/0118805 A1* 6/2004 Hareland .............. H01L 21/266
  216/13
2008/0020540 A1* 1/2008 Takeda .................... H01L 28/75
  257/E21.09
2008/0305442 A1* 12/2008 Sato ..................... G01R 33/093
  430/324

* cited by examiner

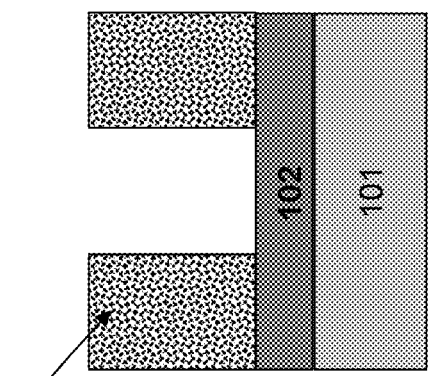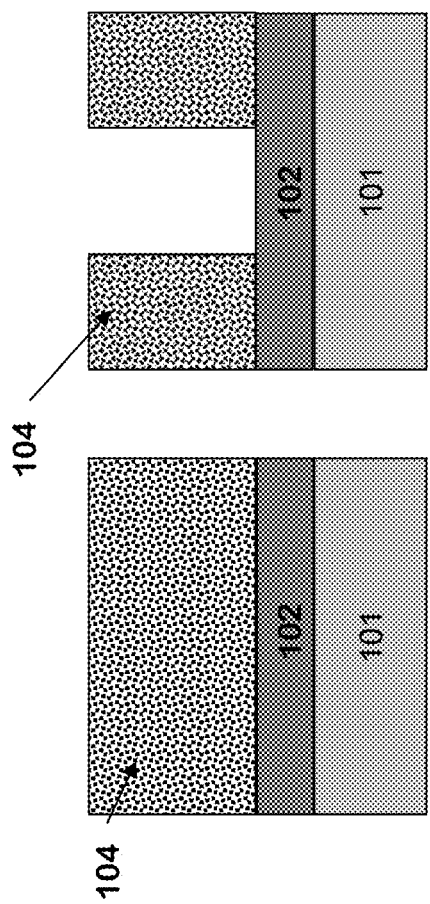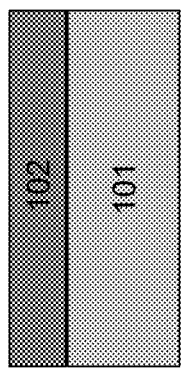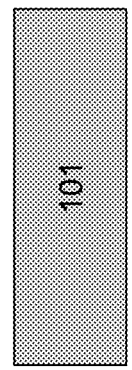

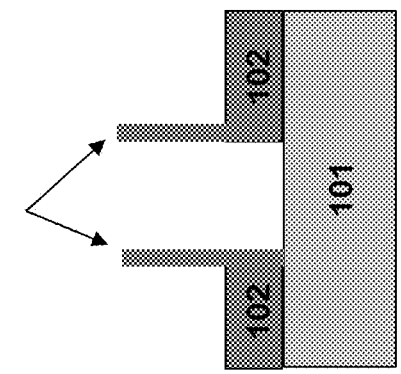
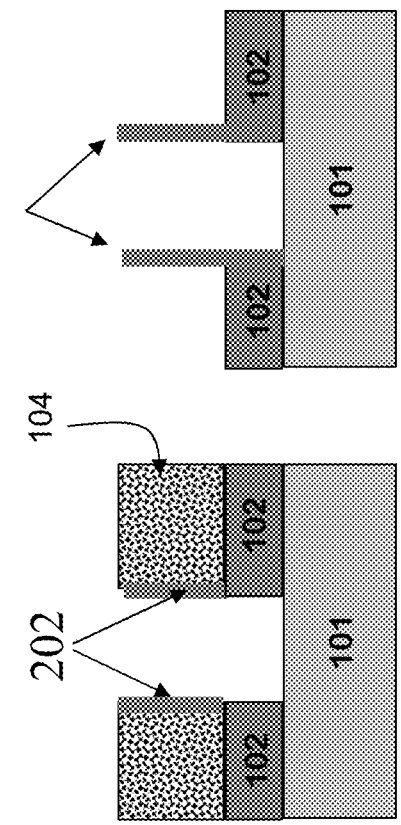
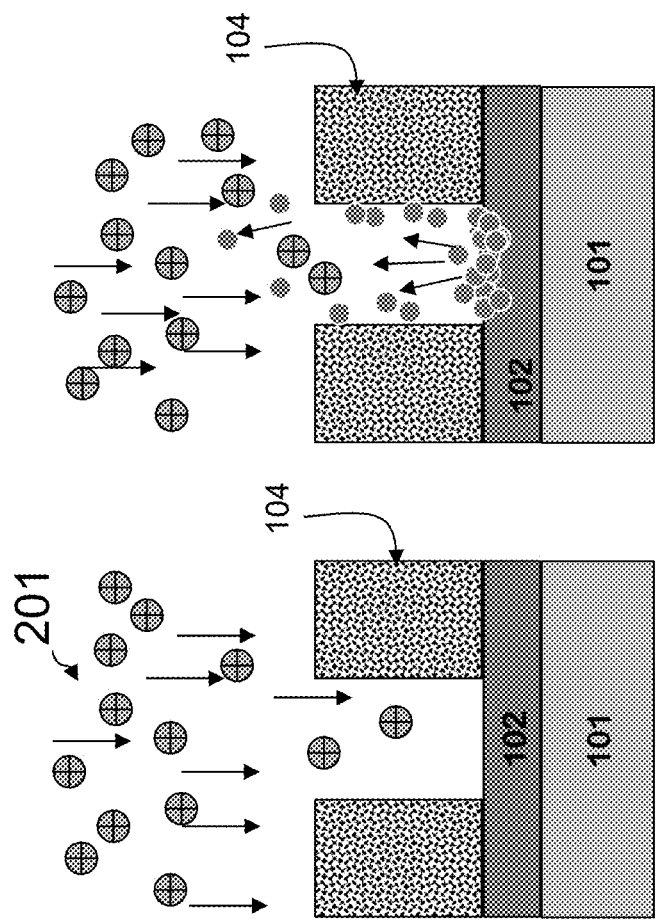
Fig. 2A  Fig. 2B  Fig. 2C  Fig. 2D

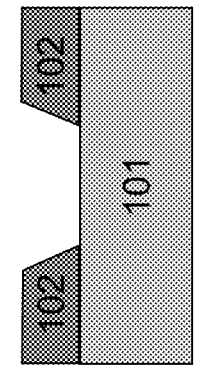
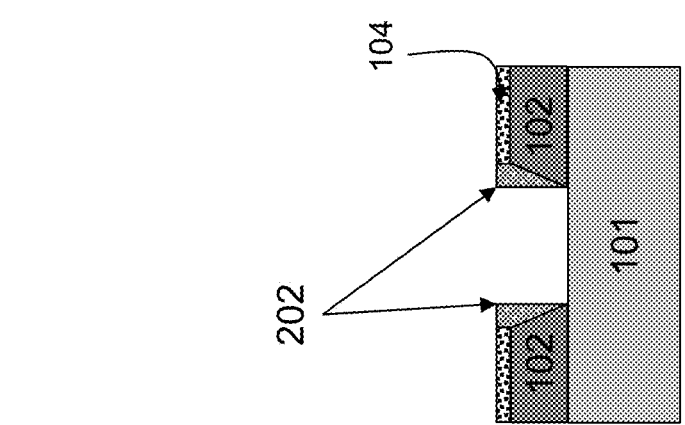
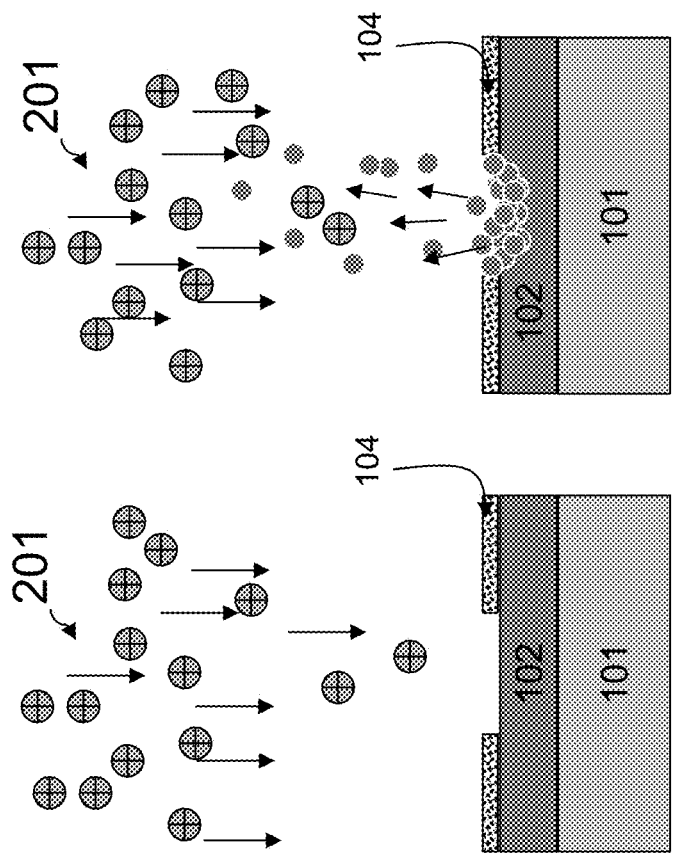
Fig. 4A  Fig. 4B  Fig. 4C  Fig. 4D

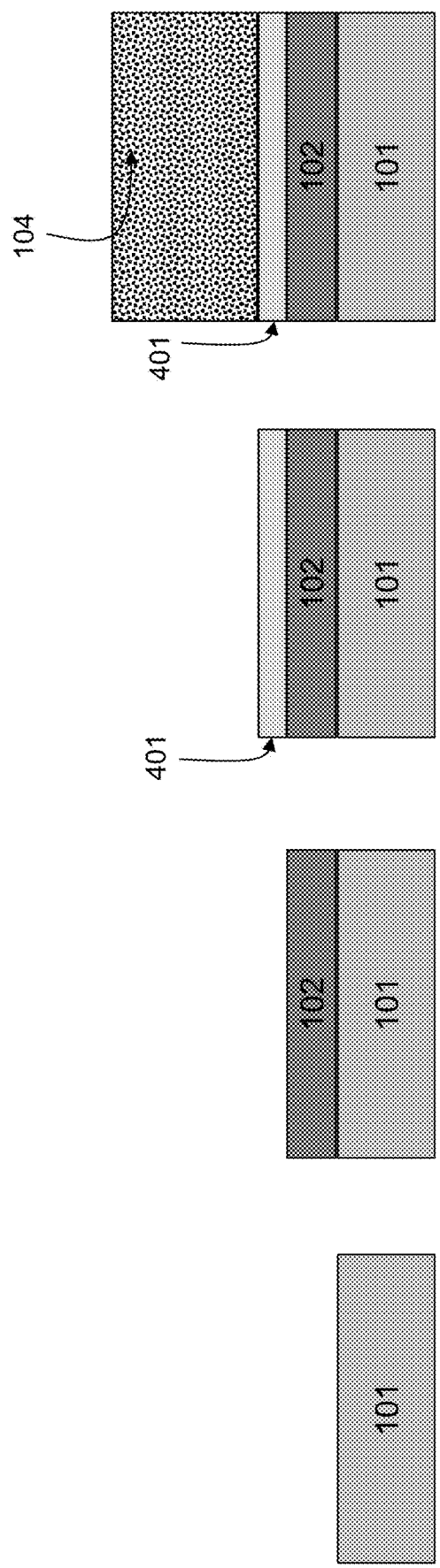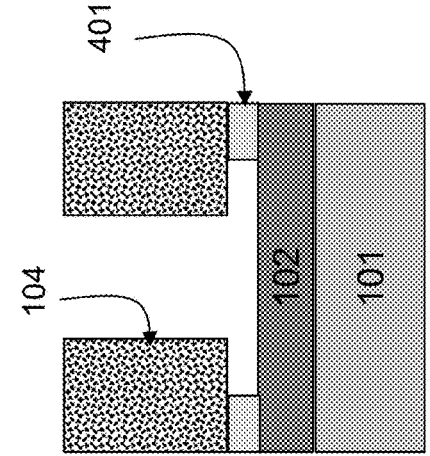

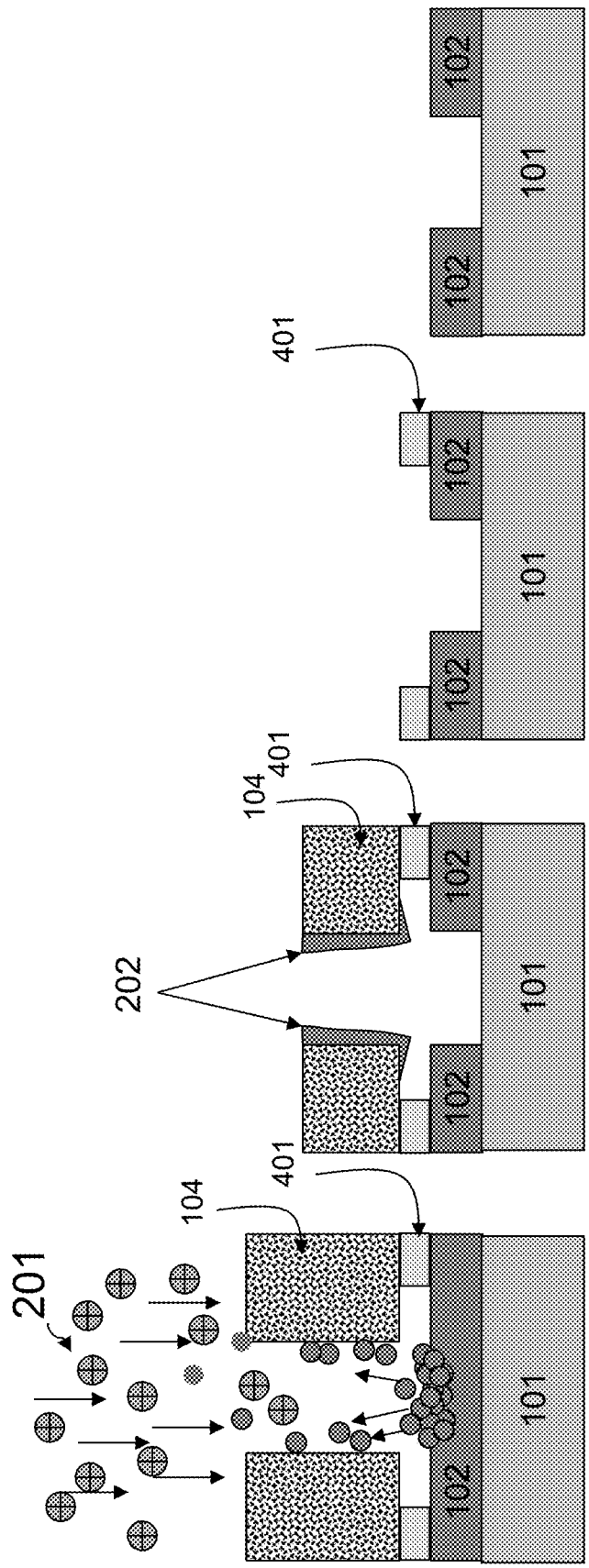

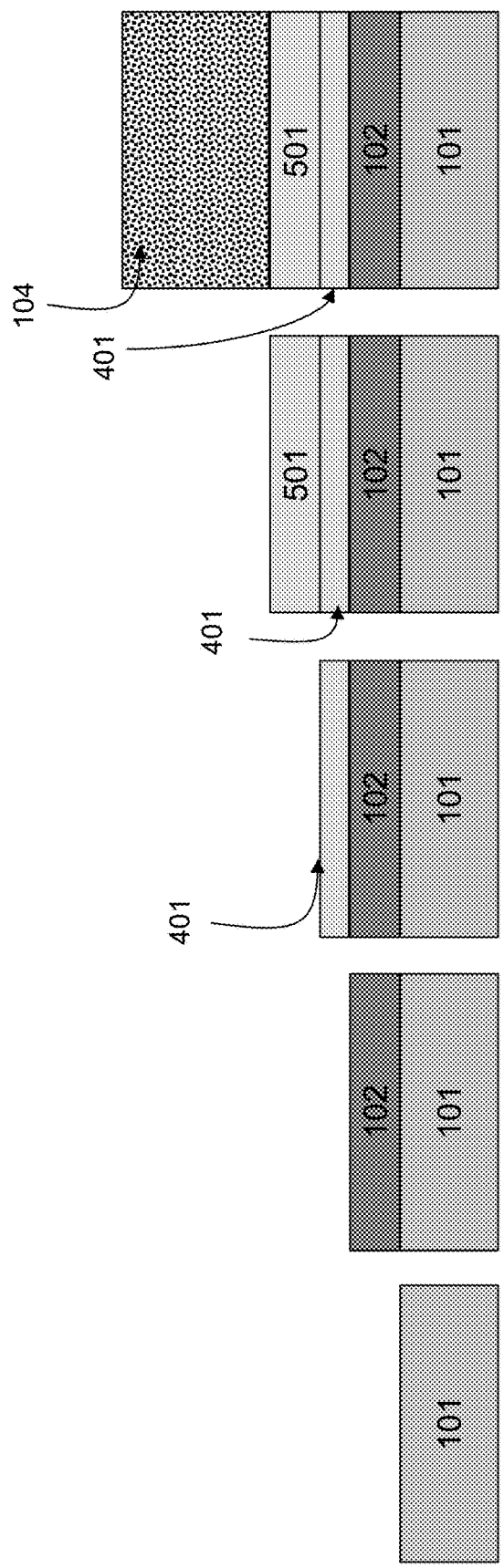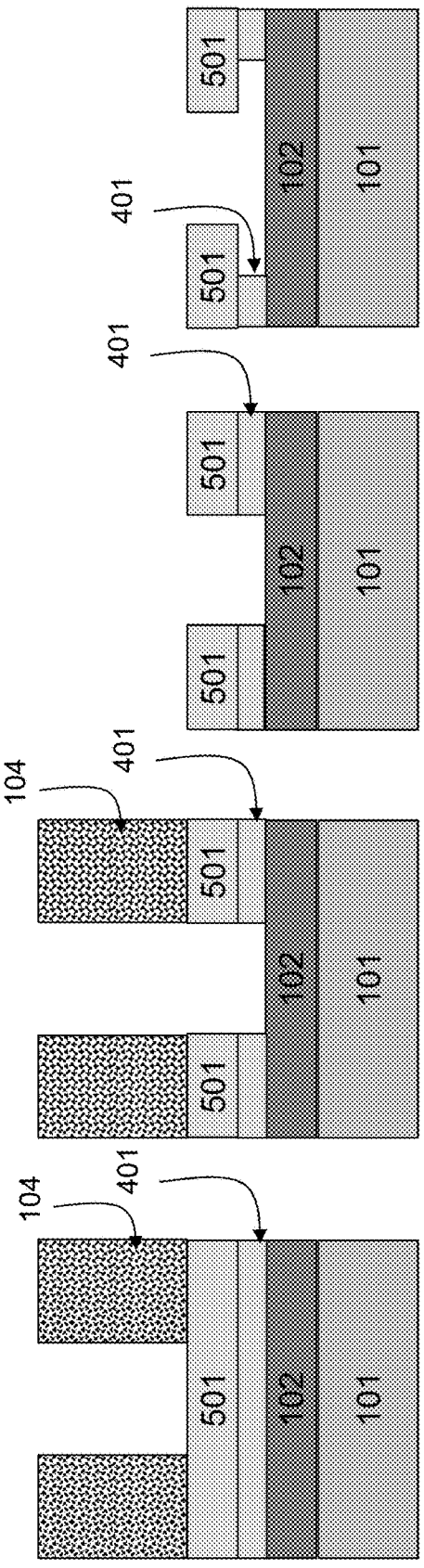

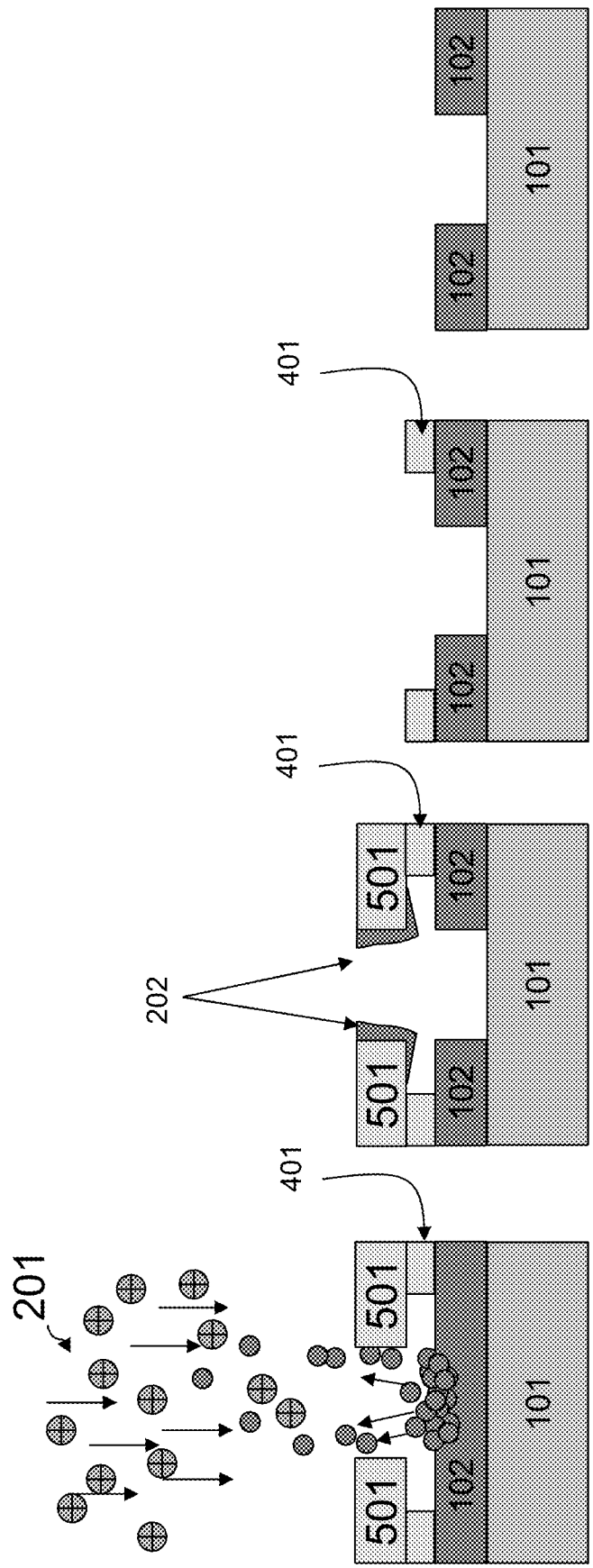

METHOD FOR REMOVING RE-SPUTTERED MATERIAL FROM PATTERNED SIDEWALLS

CROSS REFERENCES TO RELATED APPLICATIONS

This application claims priority from and is related to commonly owned U.S. Provisional Patent Application Ser. No. 62/949,653 filed Dec. 18, 2019, entitled: METHOD FOR REMOVING RE-SPUTTERED MATERIAL FROM PATTERNED SIDEWALLS, this Provisional Patent Application incorporated by reference herein.

FIELD OF THE INVENTION

The present invention relates to a method for etching a non-volatile thin film, and more particularly, to a method for dry-etching a non-volatile thin film whereby re-sputtered material is removed from patterned sidewalls.

BACKGROUND OF THE INVENTION

In dry etching there are many materials that do not readily form etching byproducts with sufficient vapor pressure to desorb surface reactions. One approach to pattern these challenging thin films is to use methods that rely more on physical mechanisms (i.e. sputtering with ion driven processes). Unfortunately, these physical processes often result in etched material being redeposited on the patterned sidewalls of the masking material. When the patterned masking material is removed, the re-sputtered etched material that was on the sidewall of the masking material leaves features projecting above the etched material. These features, sometimes referred to as rabbit or dog ears, fences and veils, may fall over, break and cause particles, or pierce other layers from subsequent processing.

Nothing in the prior art provides the benefits attendant with the present invention.

Therefore, it is an object of the present invention to provide an improvement which overcomes the inadequacies of the prior art devices and which is a significant contribution to the advancement of lithographically patterning non-volatile metals using ion driven processes.

Another object of the present invention is to provide a method for removing re-sputtered material on a substrate, the method comprising: providing a process chamber; providing a plasma source operatively connected to the process chamber; providing a substrate support within the process chamber; providing the substrate having an upper surface and a lower surface; patterning a masking material having a patterned sidewall onto the upper surface of the substrate; patterning a sacrificial layer between the upper surface of the substrate and the masking material; placing the lower surface of the substrate onto the substrate support; generating a plasma using the plasma source; processing the substrate on the substrate support using the generated plasma; and removing the sacrificial layer.

Yet another object of the present invention is to provide a method for removing re-sputtered material on a substrate, the method comprising: providing a process chamber; providing a plasma source operatively connected to the process chamber; providing a substrate support within the process chamber; providing the substrate having an upper surface and a lower surface; patterning a masking material having a patterned sidewall onto the upper surface of the substrate; patterning a sacrificial layer between the upper surface of the substrate and the masking material, at least a portion of the sacrificial layer does not overlap an area of the substrate that is overlapped by the masking material; placing the lower surface of the substrate onto the substrate support; generating a plasma using the plasma source; processing the substrate on the substrate support using the generated plasma; and removing the sacrificial layer.

Still yet another object of the present invention is to provide a method for removing re-sputtered material on a substrate, the method comprising: providing a process chamber; providing a plasma source operatively connected to the process chamber; providing a substrate support within the process chamber; providing the substrate having an upper surface and a lower surface; patterning a masking material having a patterned sidewall onto the upper surface of the substrate; patterning a sacrificial layer between the upper surface of the substrate and the masking material, the sacrificial layer having a sacrificial sidewall; placing the lower surface of the substrate onto the substrate support; generating a plasma using the plasma source; processing the substrate on the substrate support using the generated plasma; removing the masking material; and removing the sacrificial layer.

The foregoing has outlined some of the pertinent objects of the present invention. These objects should be construed to be merely illustrative of some of the more prominent features and applications of the intended invention. Many other beneficial results can be attained by applying the disclosed invention in a different manner or modifying the invention within the scope of the disclosure. Accordingly, other objects and a fuller understanding of the invention may be had by referring to the summary of the invention and the detailed description of the preferred embodiment in addition to the scope of the invention defined by the claims taken in conjunction with the accompanying drawings.

SUMMARY OF THE INVENTION

The present invention is a derivative of an additive method to patterning thin metal layers known as "lift-off". Similar to a structure used in lift-off, a layered structure is formed with an undercut or isotropically etched sacrificial layer below the patterning layer. Following etching the material that was physically etched and redeposited on sidewalls will be removed along with the sacrificial layer. With the proper choice of sacrificial layer material and structured to form the undercut, the formation of "ears" is avoided.

Another feature of the present invention is to provide a method for removing re-sputtered material on a substrate. The method comprising a process chamber being provided that is operatively connected to a plasma source. The substrate having an upper surface and a lower surface is provided on a substrate support that is provided within the process chamber. The substrate can further comprise an etch layer and a stop layer. The substrate can be a semiconductor substrate. The substrate can contain silicon. A masking material having a patterned sidewall is patterned onto the upper surface of the substrate. The patterned sidewall can further comprise a vertical wall. The patterned sidewall can have a reentrant slope or at least a portion of the patterned sidewall having a positive slope. A sacrificial layer is patterned between the upper surface of the substrate and the masking material. The sacrificial layer can contain a sacrificial sidewall. The sacrificial layer can further comprise an organic material, a metallic material and/or a dielectric material. The sacrificial layer can contain polyimide, can contain aluminum, can contain chromium, can contain oxygen, can contain nitrogen and/or contain silicon. The sacrificial layer can be a photoresist, can be amorphous, can be inorganic and/or can be photodefineable. The lower surface of the substrate is placed onto the substrate support. A plasma is generated using the plasma source. The substrate is processed on the substrate support using the generated plasma. The processing of the substrate can be a plasma etch and/or ion beam etch. The etch process can remove exposed substrate material. The etch process can generate etch byproducts. The etch byproducts can redeposit on the patterned sidewalls. Redeposited etch byproducts do not form a continuous film connecting the sidewall of the masking material and the sacrificial layer sidewall. In a preferred embodiment, the etch byproducts do not redeposit on the sacrificial sidewall. The masking material can be removed. The sacrificial layer is removed.

Yet another feature of the present invention is to provide a method for removing re-sputtered material on a substrate. The method comprising a process chamber being provided that is operatively connected to a plasma source. The substrate having an upper surface and a lower surface is provided on a substrate support that is provided within the process chamber. The substrate can further comprise an etch layer and a stop layer. The substrate can be a semiconductor substrate. The substrate can contain silicon. A masking material having a patterned sidewall is patterned onto the upper surface of the substrate. The patterned sidewall can further comprise a vertical wall. The patterned sidewall can have a reentrant slope or at least a portion of the patterned sidewall having a positive slope. A sacrificial layer is patterned between the upper surface of the substrate and the masking material, at least a portion of the sacrificial layer does not overlap an area of the substrate that is overlapped by the masking material. At least a portion of the etch not overlapped by the sacrificial layer does not contact the substrate. The sacrificial layer can contain a sacrificial sidewall. The sacrificial layer can further comprise an organic material, a metallic material and/or a dielectric material. The sacrificial layer can contain polyimide, can contain aluminum, can contain chromium, can contain oxygen, can contain nitrogen and/or contain silicon. The sacrificial layer can be a photoresist, can be amorphous, can be inorganic and/or can be photodefineable. The lower surface of the substrate is placed onto the substrate support. A plasma is generated using the plasma source. The substrate is processed on the substrate support using the generated plasma. The processing of the substrate can be a plasma etch and/or ion beam etch. The etch process can remove exposed substrate material. The etch process can generate etch byproducts. The etch byproducts can redeposit on the patterned sidewalls. Redeposited etch byproducts do not form a continuous film connecting the sidewall of the masking material and the sacrificial layer sidewall. In a preferred embodiment, the etch byproducts do not redeposit on the sacrificial sidewall. The masking material can be removed. The sacrificial layer is removed.

Still yet another feature of the present invention is to provide a method for removing re-sputtered material on a substrate. The method comprising a process chamber being provided that is operatively connected to a plasma source. The substrate having an upper surface and a lower surface is provided on a substrate support that is provided within the process chamber. The substrate can further comprise an etch layer and a stop layer. The substrate can be a semiconductor substrate. The substrate can contain silicon. A masking material having a patterned sidewall is patterned onto the upper surface of the substrate. The patterned sidewall can further comprise a vertical wall. The patterned sidewall can have a reentrant slope or at least a portion of the patterned sidewall having a positive slope. A first sacrificial layer is patterned between the upper surface of the substrate and the masking material and the first sacrificial layer contains a sacrificial sidewall. A second sacrificial layer can be deposited onto the first sacrificial layer. The first and second sacrificial layers can further comprise an organic material, a metallic material and/or a dielectric material. The first and second sacrificial layers can contain polyimide, can contain aluminum, can contain chromium, can contain oxygen, can contain nitrogen and/or contain silicon. The first and second sacrificial layers can be a photoresist, can be amorphous, can be inorganic and/or can be photodefineable. The lower surface of the substrate is placed onto the substrate support. A plasma is generated using the plasma source. The substrate is processed on the substrate support using the generated plasma. The processing of the substrate can be a plasma etch and/or ion beam etch. The etch process can remove exposed substrate material. The etch process can generate etch byproducts. The etch byproducts can redeposit on the patterned sidewalls. Redeposited etch byproducts do not form a continuous film connecting the sidewall of the masking material and the first sacrificial layer sidewall. In a preferred embodiment, the etch byproducts do not redeposit on the sacrificial sidewall. The masking material can be removed. The first and second sacrificial layers are removed.

The foregoing has outlined rather broadly the more pertinent and important features of the present invention in order that the detailed description of the invention that follows may be better understood so that the present contribution to the art can be more fully appreciated. Additional features of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

FIGS. 1A-1D are a schematic view of patterning a substrate according to the prior art;

FIGS. 2A-2D are a schematic view of sidewall re-deposition during an ion etch according to the prior art;

FIGS. 4A-4D are a schematic view of a lift off process according to one embodiment of the present invention;

FIGS. 5A-5G are a schematic view of a lift off process according to one embodiment of the present invention;

FIGS. 6A-6D are a schematic view of a lift off process according to one embodiment of the present invention;

FIGS. 7A-7I are a schematic view of a lift off process according to one embodiment of the present invention;

FIGS. 8A-8D are a schematic view of a lift off process according to one embodiment of the present invention.

Similar reference characters refer to similar parts throughout the several views of the drawings.

DETAILED DESCRIPTION OF THE INVENTION

Primary application is for semiconductor or material processing for making devices on substrates such as silicon, sapphire, AlTiC, quartz, fused silica, compound semiconductor (GaAs, InP, GaSb, AlN, GaN, etc.). During plasma etching, when material that does not readily form volatile plasma etch byproducts with sufficient vapor pressure the material can still be etched by physical sputtering. During this physical sputtering process the material can redeposit along the sidewalls of the masking material (e.g., photoresist) being used to define the areas to be etched and remain unetched. When the masking material is removed the redeposited sputtered byproducts often remain and "ears" can be formed on the sidewall of the masking material (often referred to as rabbit or dog ears, fences, veils). These features are now standing up above the material. The "ears" may fall over, break and cause particles, or pierce other layers from subsequent processing.

As shown in FIGS. 1A-1D, the prior art process was to provide a substrate 101 and deposit a difficult to etch material 102 onto the substrate 101. Then, deposit a masking material 104 onto the difficult to etch material 102. The masking material 104 is then patterned as shown in FIG. 1D. The process is then continued in FIGS. 2A-2D where accelerated ions 201 are used to etch the difficult to etch material 102. As shown in FIG. 2B, during the etch process, etching material 102 is redeposited onto the patterned masking material 104. As shown in FIG. 2D, after the removal of the patterned masking material 104, there remains "dog ears" 203 as a result of the sputtered material.

Figures 3A, 3B, 3C, 3D:
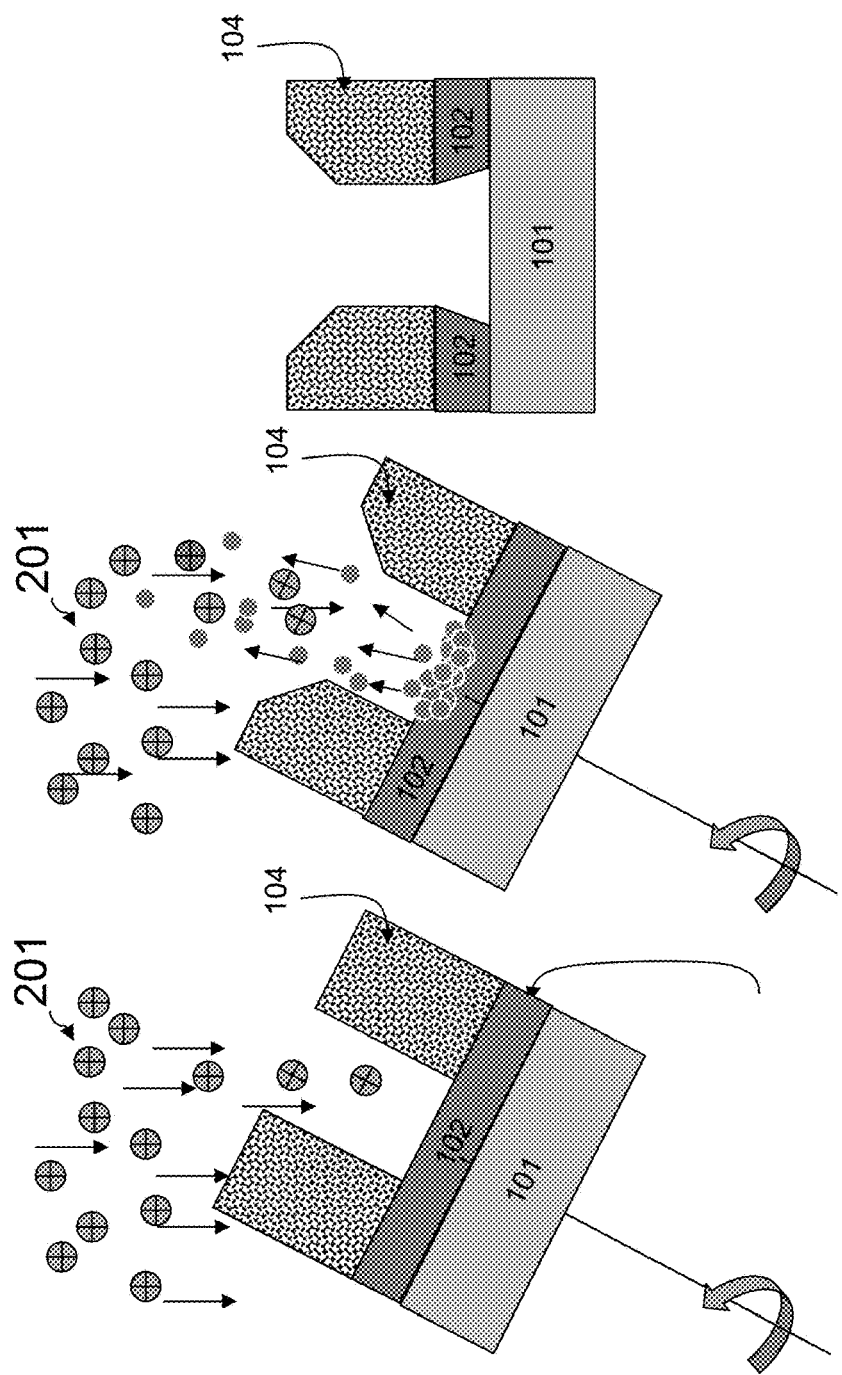
FIGS. 3A-3D are a schematic view of sidewall re-deposition during ion milling with tilt and rotation according to the prior art.

The same issue of sputtered material being redeposited on the sidewalls of the patterned masking material of the prior art is shown in FIGS. 3A and 3B where an ion beam source with tilt and rotation is used to produce ions 201 to etch the difficult to etch material 102. The redeposited material causes a change in the critical dimension as shown in FIG. 3C which results in a sloped feature as shown in FIG. 3D.

The same issue of sputtered material being redeposited on the sidewalls of the patterned masking material of the prior art is shown in FIGS. 4A and 4B where an ion beam source is used to produce ions 201 to etch the difficult to etch material 102. The redeposited material 202 causes a change in the critical dimension as shown in FIG. 4C which results in a sloped feature as shown in FIG. 4D.

In the present invention, we describe a lithographic approach to mitigate the effects of etching non-volatile metals (e.g., platinum) by utilizing sacrificial layers to lift off the residual fences during the stripping of the masking material. The central elements of the process are described schematically in FIGS. 5A to 5G. In FIG. 5A, a substrate 101 is provided. In FIG. 5B, the difficult to etch material 102 is deposited onto the substrate 101. In FIG. 5C, a sacrificial layer 401 is deposited onto the difficult to etch material 102. In FIG. 5D, the masking material 104 is deposited onto the sacrificial layer 401. In FIG. 5E, the masking material 104 is patterned. In FIG. 5F, the sacrificial layer 401 is patterned. In FIG. 5G, there is an isotropic etch of the sacrificial layer 401 to create an undercut below the patterned masking material 104. Steps 5F and 5G may be performed in one operation.

In FIG. 6A, accelerated ions 201 are used to etch the difficult to etch material 102. In FIG. 6B, sputtered etching material 102 is redeposited 202 onto the sidewalls of the patterned masking material 104. In FIG. 6C, the patterned masking material 104 is removed leaving the sacrificial layer 401. In FIG. 6D, the sacrificial layer 401 is removed.

In FIG. 7A, a substrate 101 is provided. In FIG. 7B, the difficult to etch material 102 is deposited onto the substrate 101. In FIG. 7C, a first sacrificial layer 401 is deposited onto the difficult to etch material 102. In FIG. 7D, a second sacrificial layer 501 is deposited onto the first sacrificial layer 401. In FIG. 7E, the masking material 104 is deposited onto the sacrificial layers 401, 501. In FIG. 7F, the masking material 104 is patterned. In FIG. 7G, the sacrificial layers 401, 501 are patterned. In FIG. 7H, the masking material 104 is removed. In FIG. 7I, there is an isotropic etch of the first sacrificial layer 401 on the substrate 101 to create an undercut below the second sacrificial layer 501. Steps 7H and 7I may be performed in one operation.

In FIG. 8A, accelerated ions 201 are used to etch the difficult to etch material 102. In FIG. 8B, sputtered etching material 102 is redeposited 202 onto the sidewalls of the second sacrificial layer 501. In FIG. 8C, the second sacrificial layer 501 is removed leaving the first sacrificial layer 401. In FIG. 8D, the first sacrificial layer 401 is removed. The first sacrificial layer 401 and the second sacrificial layer 501 can be removed in one process step.

Figure 9:
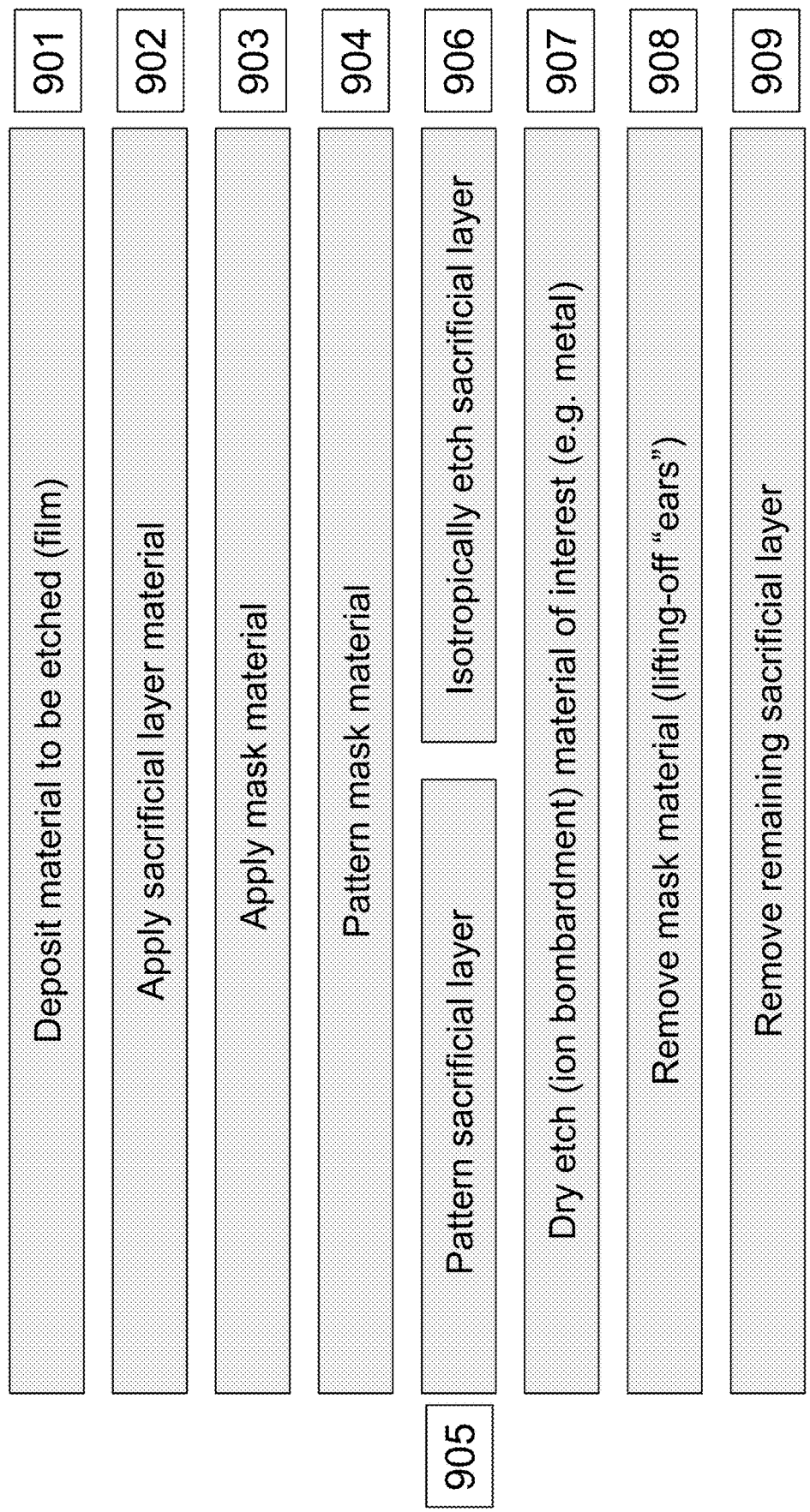
FIG. 9 is a flow chart of a lift off process according to one embodiment of the present invention.

FIG. 9, is a flow diagram of one embodiment according to the present invention. In step 901, the material to be etched is deposited onto the substrate. In step 902, a sacrificial layer is applied to the material to be etched. In step 903, a masking material is applied onto the sacrificial layer. In step 904, the masking material is patterned. In step 905, the sacrificial layer is patterned. In step 906, the sacrificial layer is isotropically etched. In step 907, the material to be etched is ion bombarded during a dry etch process. In step 908, the masking material is removed. In step, 909, the sacrificial layer is removed to complete the process.

Experiments

Platinum films were prepared on silicon wafers by DC sputtering (AJA International). In-situ, the wafers were cleaned with an Ar plasma, then sequentially coated with 2 nm Ti adhesion layer and 100 nm Pt at 3 mTorr. The sacrificial layer was deposited or spin-coated. The masking material was patterned by photolithography (GCA AS200 i-line stepper, 5×) in SPR700-1.2 photoresist. The pattern consists of lines and spaces at equal pitch ranging from 0.5 j.tm to 20 j.tm. The platinum was etched in an argon ion-milling system at normal incidence with 600V bias The sacrificial layers investigated fall into two categories: inorganic films and photoresist materials. Samples prepared with inorganic sacrificial layers have said layer deposited prior to lithography. The undercut profile is formed with an isotropic etch.

The sample is then loaded into the ion mill for platinum patterning. The primary material investigated in this category is silicon nitride deposited by PECVD and etched in an isotropic $SF_6/O_2$ plasma (Plasmatherm PT72). The primary photoresist-based sacrificial layer investigated is Microchem LOR resist. This material dissolves in developer solution, producing an undercut profile concurrently with the lithography process. The thickness is controlled by spin-coating and viscosity, and the undercut rate is controlled by soft-bake temperature. After etching, the photoresist was dissolved in heated 1165 stripper (~50° C.) with ultrasonic agitation for 30 minutes, followed by rinsing in acetone, isopropanol, and DI water.

Results

Initial experiments focused on silicon nitride sacrificial layers. Silicon nitride was deposited at 350° C. by PECVD to a thickness of 180 nm on top of sputtered platinum. To produce an undercut, the film was etched in an $SF_6/O_2$ plasma which etches silicon nitride isotropically at 60 nm/min. This material was etched for 5 minutes, producing an undercut around 300 nm at the base of the feature. Subsequently the ion milling recipe was followed as described above. The silicon nitride was removed with 170° C. phosphoric acid.

In any embodiment of the present invention, multiple sacrificial layers can be used.

In any embodiment of the present invention, the ion bombardment can be through a plasma etch system, ion beam system and/or ion milling system.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and scope of the invention.

What is claimed is:

1. A method for removing re-sputtered material on a substrate, the method comprising:
   providing a process chamber;
   providing a plasma source operatively connected to the process chamber;
   providing a substrate support within the process chamber;
   providing the substrate having an upper surface and a lower surface;
   depositing an etch material onto an upper surface of the substrate;
   depositing a sacrificial layer onto an upper surface of the etch material;
   depositing a masking material onto an upper surface of the sacrificial layer;
   patterning the masking material;
   patterning the sacrificial layer;
   etching the sacrificial layer, wherein a first opening in the sacrificial layer undercuts a second opening in the patterned masking material;
   placing the lower surface of the substrate onto the substrate support;
   generating a plasma using the plasma source;
   etching the etch material using the generated plasma, wherein sputtered etch material is redeposited onto a sidewall of the patterned masking material;
   removing the patterned masking material; and
   removing the sacrificial layer.

2. The method according to claim 1, wherein the etch material further comprises a non-volatile metal.

3. The method according to claim 1, wherein the masking material is a photoresist material and the sacrificial layer is a photoresist material.

4. The method according to claim 1, wherein the sacrificial layer further comprises an organic material.

5. The method according to claim 1, wherein the sacrificial layer further comprises a metallic material.

6. The method according to claim 1, wherein the sacrificial layer further comprises a dielectric material.

7. A method for removing re-sputtered material on a substrate, the method comprising:
   providing a process chamber;
   providing a plasma source operatively connected to the process chamber;
   providing a substrate support within the process chamber;
   providing the substrate having an upper surface and a lower surface;
   depositing an etch material onto an upper surface of the substrate;
   depositing a first sacrificial layer onto an upper surface of the etch material;
   depositing a second sacrificial layer onto an upper surface of the first sacrificial layer;
   depositing a masking material onto an upper surface of the sacrificial layers;
   patterning the masking material;
   patterning the sacrificial layers;
   removing the patterned masking material;
   etching the first sacrificial layer, wherein a first opening in the first sacrificial layer undercuts a second opening in the second sacrificial layer;
   placing the lower surface of the substrate onto the substrate support;
   generating a plasma using the plasma source;
   etching the etch material using the generated plasma, wherein sputtered etch material is redeposited onto a sidewall of the second sacrificial layer;
   removing the second sacrificial layer; and
   removing the first sacrificial layer.

8. The method according to claim 7, wherein the etch material further comprises a non-volatile metal.

9. The method according to claim 7, wherein the masking material is a photoresist material and the sacrificial layers are a photoresist material.

10. The method according to claim 7, wherein the sacrificial layers further comprises an organic material.

11. The method according to claim 7, wherein the sacrificial layers further comprises a metallic material.

12. The method according to claim 7, wherein the sacrificial layers further comprises a dielectric material.

* * * * *